United States Patent [19]
Whitehead et al.

[11] Patent Number: 5,485,081
[45] Date of Patent: Jan. 16, 1996

[54] TEST POINT REDUCTION SYSTEM FOR A PRINTED CIRCUIT BOARD TEST SYSTEM

[75] Inventors: Robert E. Whitehead, Irving; Evan J. Evans, Alvord; Stephen J. Foster, Garland, all of Tex.

[73] Assignee: Electronic Packaging Co., Dallas, Tex.

[21] Appl. No.: 883,160

[22] Filed: May 14, 1992

Related U.S. Application Data

[63] Continuation-in-part of Ser. No. 605,925, Oct. 30, 1990, abandoned.

[51] Int. Cl.$^6$ .................................................. G06F 3/06
[52] U.S. Cl. ................................ 324/158.1; 324/73.1
[58] Field of Search ..................... 324/158 F, 158 P, 324/500, 537, 158 R, 73.1, 754, 760, 158.1; 371/15.1, 16.1; 364/506, 481, 550

[56] References Cited

U.S. PATENT DOCUMENTS

| | | | |
|---|---|---|---|
| 4,175,253 | 11/1979 | Pitegoff | 324/62 |
| 4,186,338 | 1/1980 | Fichtenbaum | 324/52 |
| 4,352,165 | 9/1982 | Hevenor, Jr. | 364/900 |
| 4,504,782 | 3/1985 | Zbinden | 324/73 |
| 4,833,402 | 5/1989 | Boegh-Petersen | 324/158 F |
| 4,924,179 | 5/1990 | Sherman | 324/158 F |
| 5,006,808 | 4/1991 | Watts | 324/537 |

OTHER PUBLICATIONS

"GSI Plotter Control Data Format Guide", Gerber Scientific Instrument Company, Jul. 19, 1983, pp. 1–7.

*Primary Examiner*—Vinh P. Nguyen
*Attorney, Agent, or Firm*—Ross, Clapp, Korn & Montgomery

[57] ABSTRACT

A system for reducing the number of points to be tested on a printed circuit board where the printed circuit board includes a plurality of network traces each having end points and a plurality of pads provides for the identification of the end points of each network trace of the plurality of network traces. Certain ones of the plurality of network traces network located within a predetermined distance of one another are grouped to form a plurality of groups of network traces. The identified end points of the grouped network traces are connected together within each group of network traces to form a continuous trace having one pair of end points for each group of network traces. The end points are used for testing the printed circuit board.

8 Claims, 10 Drawing Sheets

TEST POINT REDUCTION SYSTEM FOR A PRINTED CIRCUIT BOARD TEST SYSTEM

RELATED APPLICATION

This application is a continuation-in-part of U.S. patent application Ser. No. 07/605,925 filed Oct. 30, 1990, and entitled "Printed Circuit Board Test System", now abandoned.

TECHNICAL FIELD OF THE INVENTION

The present invention relates to systems for testing printed circuit boards, and more particularly to a system for reducing the number of test points required to completely test a printed circuit board.

BACKGROUND OF THE INVENTION

Automatic test systems for testing printed circuit boards utilize a multitude of points on the printed circuit board to which are applied various stimulus signals. Simultaneously with the application of these stimulus signals, other points on the printed circuit board are monitored for a response to the stimulus signals. By analyzing the results of the responses, it can be determined which points on the printed circuit board are connected to each other and which points are isolated. By comparing this data to the data of a reference, known good printed circuit board, or design data used to create the printed circuit board, it can be determined if the board was properly manufactured.

Typical printed circuit board test systems, such as shown in U.S. Pat. No. 4,833,402 include large numbers of programmable signal drivers for producing the various stimulation signals to be applied to the printed circuit board under test. These systems further include a large number of programmable signal receivers for receiving the signals produced by the printed circuit board under test in response to the stimulus signals. Due to rapid advances in surface mount technology and multi-layer fabrication techniques, many of the circuit boards require large numbers of test points or points located on the circuit board with minimal spacing such that these printed circuit boards exceed the capabilities of present automatic test systems.

Due to the high cost of electronic test circuity to improve the capability of existing test systems to handle present day circuit boards, it is clear that a need exists for printed circuit board test systems to reduce the number of test points required to test a circuit board while still ensuring that a complete and accurate test of a printed circuit board is achieved.

SUMMARY OF THE INVENTION

In accordance with the present invention, a system for reducing the number of points to be tested on a printed circuit board where the printed circuit board includes a plurality of network traces each having end points and a plurality of pads is provided. The system provides for the identification of the end points of each network trace of the plurality of network traces. Certain ones of the plurality of network traces located within a predetermined distance of one another are grouped to form a plurality of groups of network traces. The identified end points of the grouped network traces are connected together within each group of network traces to form a continuous trace having one pair of end points for each group of network traces. The end points are used for testing the printed circuit board.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
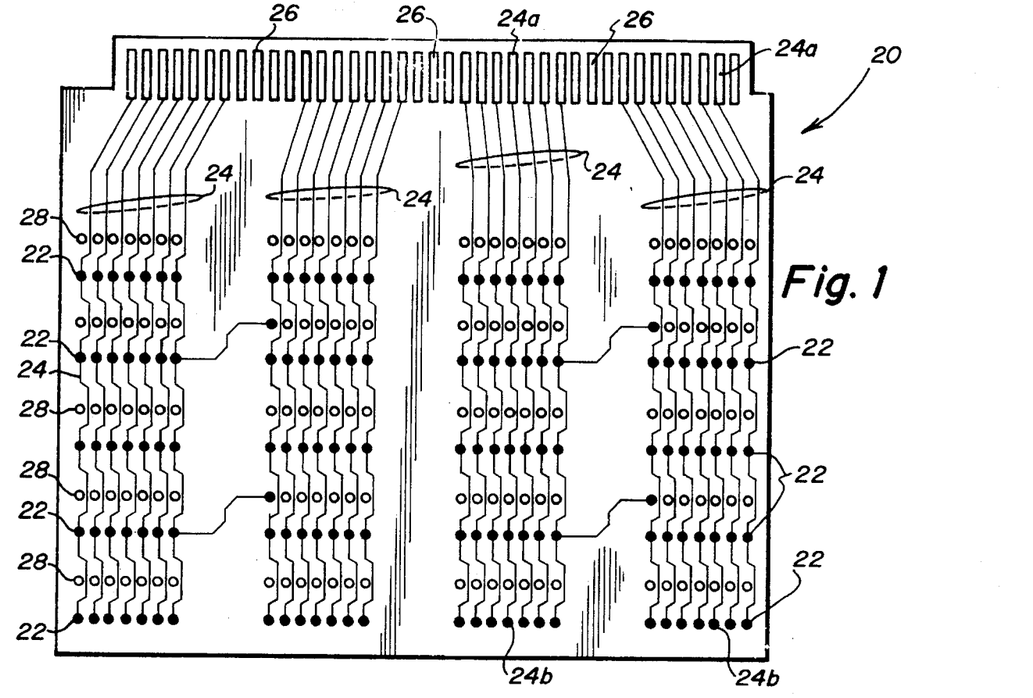
FIG. 1 illustrates a plan view of a printed circuit board including network traces and pads.

Referring to FIG. 1, a typical printed circuit board is illustrated and is generally identified by the numeral 20. Printed circuit board 20 comprises a board based material, of non-conductive material such as for example, fiberglass or plastic. Printed circuit board 20 includes a plurality of through hole pads 22 which are used for printed circuit board device mounting or as conductors to transfer signals from one layer of printed circuit board 20 to other layers. Also positioned on printed circuit board 20 are circuit network traces 24 representing conductors that carry signals from one pad 22 to other pads 22 along trace paths. Also disposed on printed circuit board 20 are surface mount pads 26 which comprise conductors used for device mounting or as an interface conductor to other electronic devices. Further included on printed circuit board 20 are unused through hole pads 28 utilized for component mounting.

Figure 2:
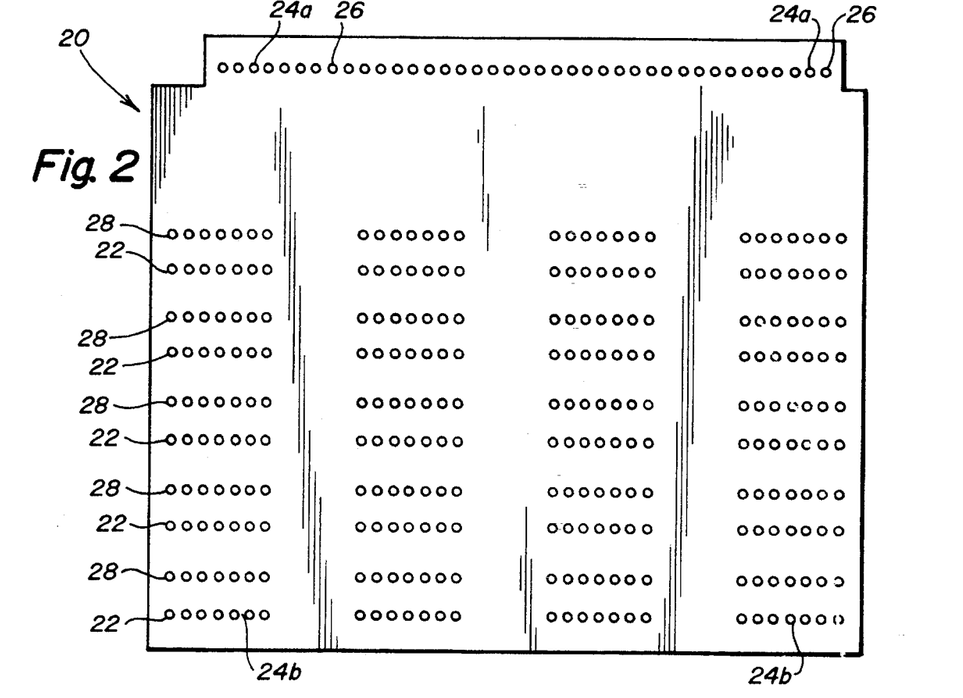
FIG. 2 illustrates the printed circuit board of FIG. 1 showing all test points and pads.

Circuit network traces 24 each include end points 24a and 24b, and each includes five through hole pads 22 and five unused through hole pads 28 which together with end point 24a represents eleven test points for each circuit network trace 24. Therefore, as illustrated in FIG. 2, in order to probe all test points on printed circuit 20, it would required 319 points to be probed representing every pad 22 on every network trace 24 and all unused pads 28.

The present invention is used in connection with a circuit board testing machine such as described in U.S. Pat. No. 4,833,402 issued May 23, 1989 and entitled "Connector Assembly for a Circuit Board Testing Machine, a Circuit Board Testing Machine, and a Method of Testing a Circuit Board by Means of a Circuit Board Testing Machine". The description and drawings of U.S. Pat. No. 4,833,402 are hereby incorporated by reference into the specification of the present application. The circuit board testing machine of U.S. Pat. No. 4,833,402 (hereinafter '402) is illustrated in FIG. 7 of the '402 Patent and includes an upper and lower test surface having a test point matrix more clearly shown in FIG. 8. The test points of the matrix are actuated through addressing or switching transistors 112 as shown in FIG. 11. Actuation of transistors 112 are controlled, in part, by operation of a microprocessor 180 (FIG. 12 of the '402 Patent). The test point selection to be carried out by microprocessor 180 and the specific test points on a printed circuit board to be tested, is the subject matter of the present invention. Data, in accordance with the present invention may be supplied to microprocessor 180 through a minicomputer 182 shown in FIG. 12 of the '402 Patent in order to reduce the number of test points required to completely test a printed circuit board using a system 70 as shown in the '402 Patent.

Figure 3:
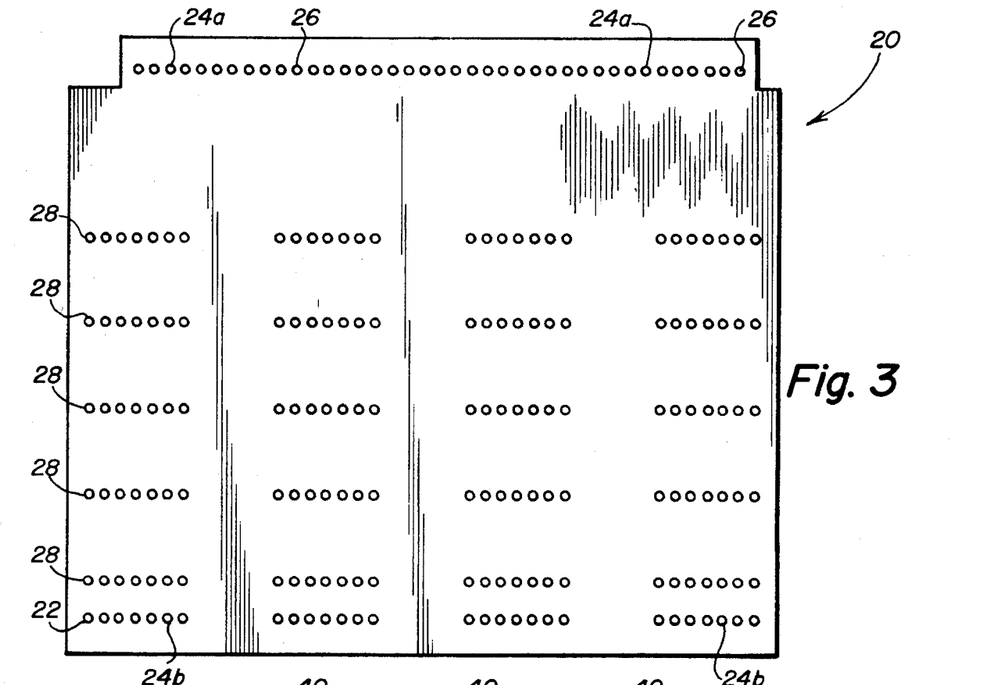
FIG. 3 illustrates the printed circuit board of FIG. 1 showing all end points of network traces and unused pads.

Referring now to FIG. 3, in accordance with the present invention, the present system eliminates testing the intermediate points on each circuit network trace 24, such that only testing of end points of each circuit network trace 24 is accomplished. Each circuit network trace is analyzed to determine end points 24*a* and 24*b* as well as pads which are intermediate points such as pads 28. By eliminating intermediate points, such as pads 22, the overall number of probes for testing printed circuit board 20 is reduced from 319 points to 207 points as illustrated in FIG. 3. It is still necessary to test all unused pads 28 as they may be shorted to each other or to one of the circuit network traces 24, and after the printed circuit board is assembled, these shorts could cause malfunctions.

Referring simultaneously to FIGS. 4, 5, 6, and 7, the present system accomplishes circuit analysis for circuit network trace groupings analyzing each circuit network trace 24 and its physical location in relation to other circuit network traces 24 and pads 28 on printed circuit board 20. A portion of the present system determines if all parts of one circuit network trace 24 is separated from all of the parts of a second circuit network trace 24 by the presence of a third network trace 24, while a second portion of the system determines the physical space between all the parts of one network trace 24 and all the parts of an adjacent network trace 24. When two network traces are found that are separated by a third network trace or separated by a predetermined minimum spacing, these network traces will be included in a single network group.

The present system then tests the other network traces on printed circuit board 20 to determine other network traces that will meet the above criteria with respect to all network traces in the group. When these network traces are located, they will be added to the designated group. A predetermined number of groups for testing of printed circuit board 20 is selected and when the number of network groups is reached, the percentage of the total number of network traces on printed circuit board 20, determined by the number of groups allowed, the next network grouping will be accomplished.

Figure 4:
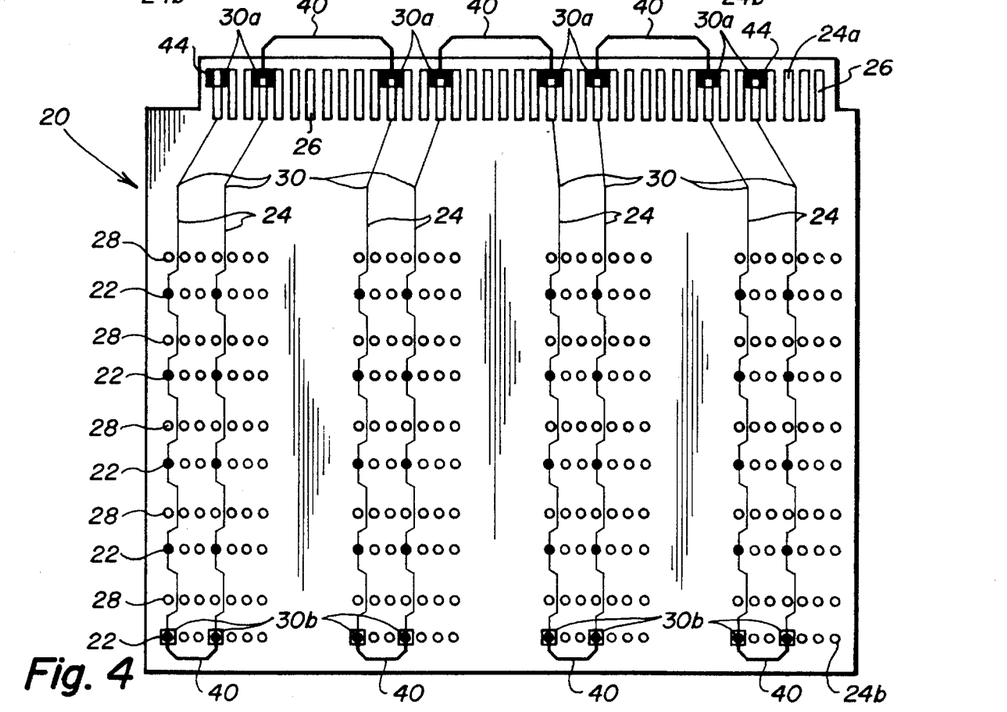
FIGS. 4–7 illustrate the printed circuit board of FIG. 1 showing groups of network traces identified in accordance with the present invention.
Figure 5:
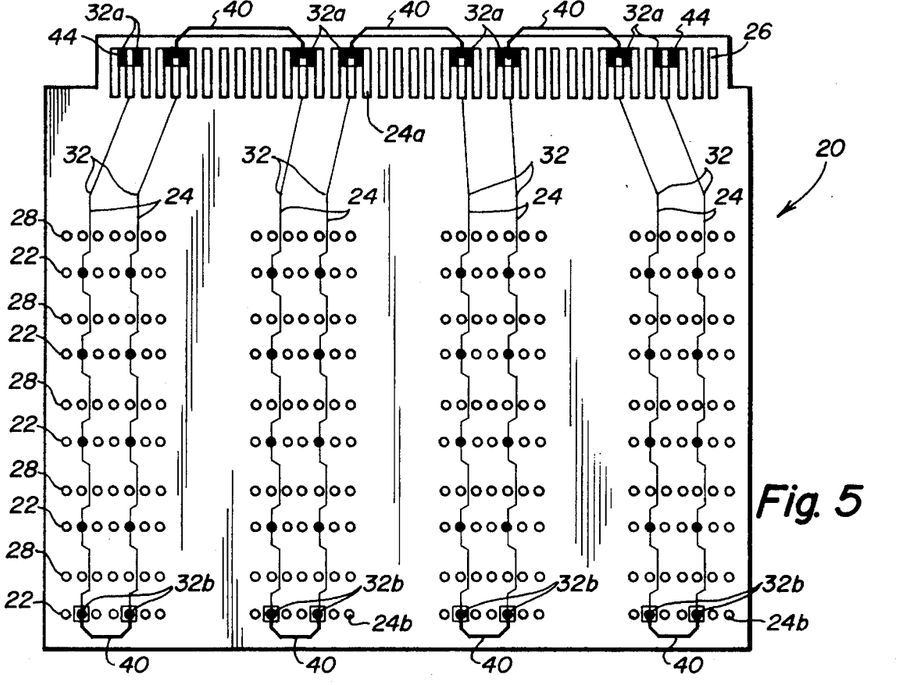
Figure 6:
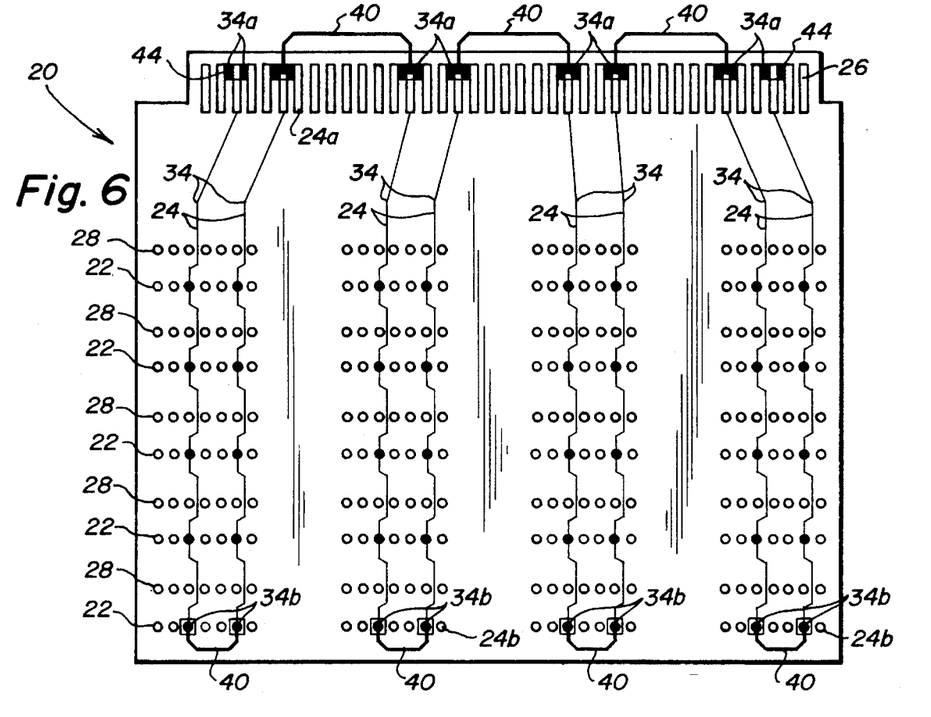
Figure 7:
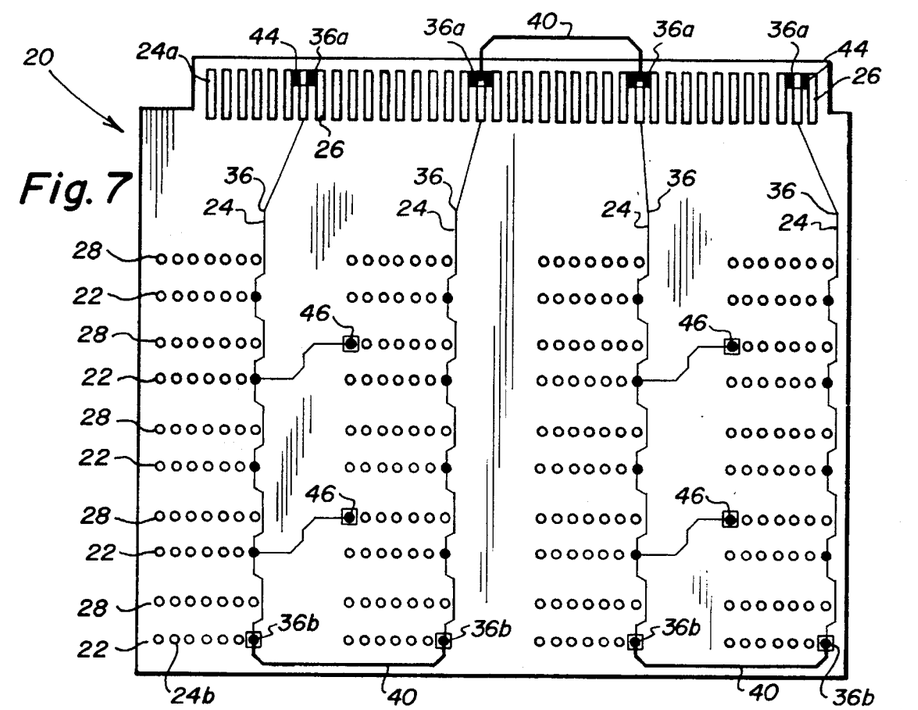

FIG. 4 illustrates a first network trace group 30 comprised of 8 circuit network traces 24. Each network trace 24 included within network trace group 30 is separated by a predetermined distance from each network trace 24 and all parts of each network trace 24 are separated from all of the parts of the other network traces 24 within group 30. Similarly, FIGS. 5 and 6 illustrate groups 32 and 34 each comprising 8 circuit network traces 24. FIG. 7 illustrates a final network trace group 36 comprising 4 network traces 24. The end points of each circuit network trace group 30 are 35 illustrated by reference numerals 30*a* and 30*b*. Similarly, the end points of group 32, 34, and 36 are represented by reference numerals 32*a, 32b; 34a, 34b;* and 36*a* and 36*b*, respectively.

The present invention then operates to interconnect the end points of each network trace 24 within a network trace group utilizing a fixture jumper 40 illustrated in FIGS. 4, 5, 6, and 7. In this manner, each network trace 24 within a group 30, 32, 34, and 36 are interconnected, such that each group has a single set of end points 44. Therefore, each network trace group 30, 32, 34 and 36 each require two end points 44 for testing the entire network group.

Further illustrated in FIG. 7, are branch end points 46 which must be tested to completely test printed circuit board 20.

Figure 8:
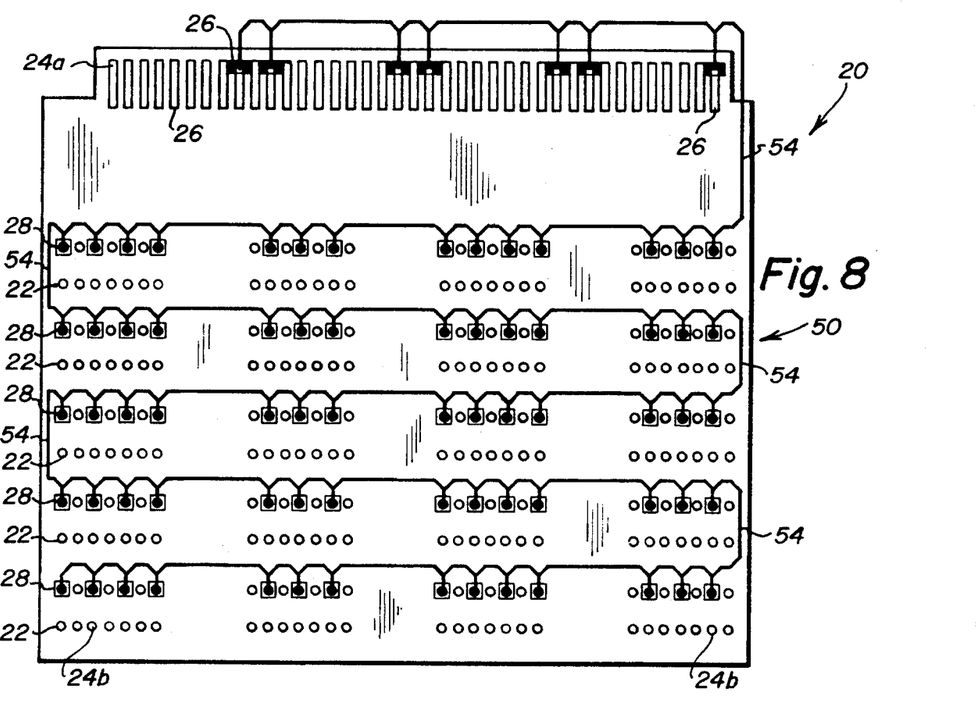
FIGS. 8 and 9 illustrate the printed circuit board of FIG. 1 showing the grouping of unused pads in accordance with the present invention.
Figure 9:
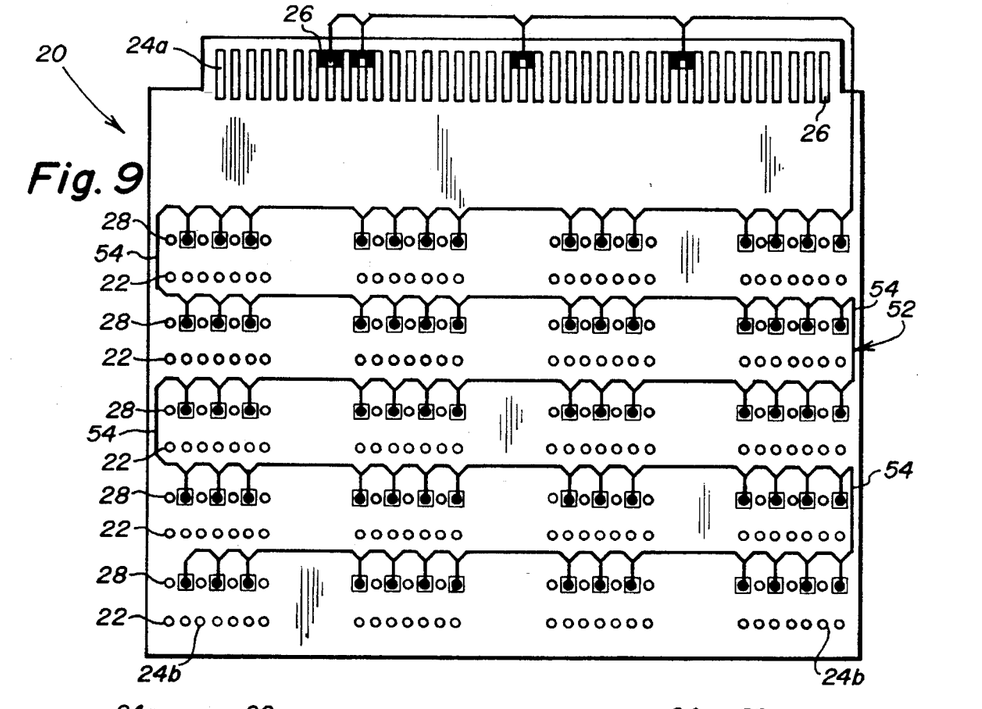

Referring now to FIGS. 8 and 9, the final operation performed by the present system is the analysis of unused pads 28. The present system determines if all parts of one unused pad 28 is separated from all of the parts of a second unused pad 28 by the presence of a third unused pad 28 or a network trace 24. Additionally, the system determines the physical space between all of the parts of one unused pad 28 and all of the parts of an adjacent unused pad 28. When two unused pads 28 are found that are separated by a third unused pad 28 or are separated by a predetermined minimum spacing, these unused pads 28 will be included in a single unused pad group and will be jumpered together into a single network that can be probed to test for shorts to the other networks and pad 28 groups. FIGS. 8 and 9 illustrate two unused pad groups 50 and 52 with each group being interconnected by fixture jumpers 54 to interconnect the unused pad groups. Surface mount pads 26 are interconnected to unused pad groups to test for any unused pads 28 being shorted on printed circuit board 20.

Figure 10:
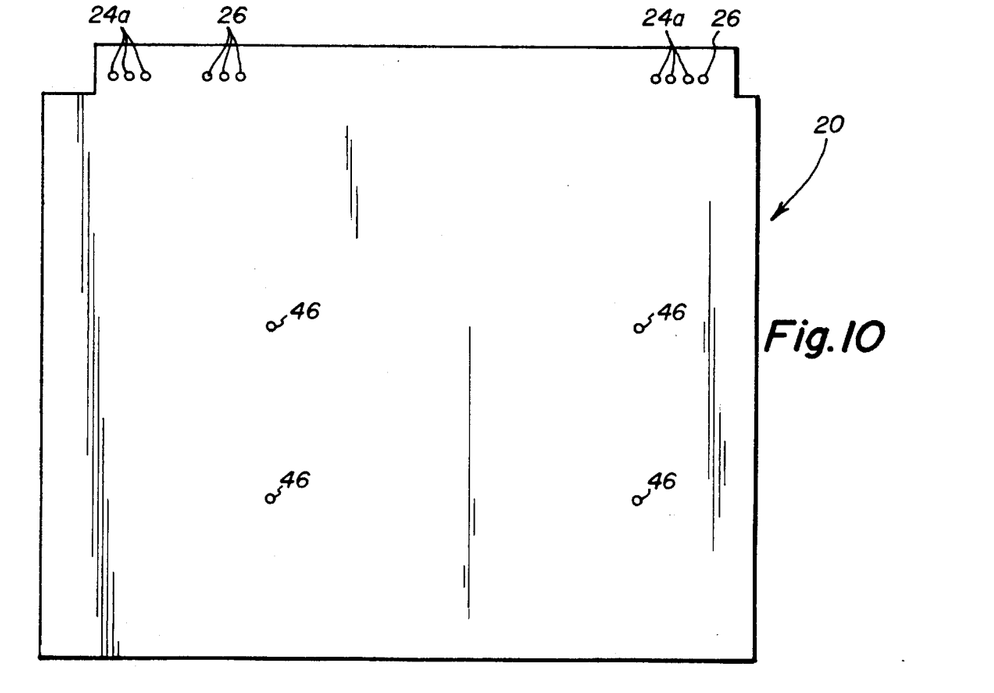
FIG. 10 illustrates the printed circuit board of FIG. 1 showing the final test points necessary to test the circuit board of FIG. 1.

FIG. 10 illustrates the final set of test points required to test printed circuit board 20 after the elimination of all intermediate points and network traces and unused pad groupings. As illustrated in FIG. 10, only 14 test points of printed circuit board 20 are necessary to test printed circuit board 20 as opposed to the 319 test points illustrated in FIG. 2.

Referring now to FIGS. 11–15, a computer software flow diagram is provided for outlining the steps of the software of the present system for reducing the number of points to be tested on a printed circuit board.

The data on which the present system operates is created through the digitization of the pattern of a printed circuit board to be analyzed. The patterns of the circuit board and the respective network traces and pads are digitized using a coordinate digitizer. The digitizer is manually traversed across the printed circuit board, and identifies and records the data extracted from the graphic material for storage in a digital storage media. Such a digitizer is described in U.S. Pat. No. 4,352,165 issued Sep. 28, 1982 and entitled "Apparatus for Storing and Retrieving Data". The drawings and specification of U.S. Pat. No. 4,352,165 are hereby incorporated by reference into the present specification. The digitizer 12 of U.S. Pat. No. 4,352,165 is utilized for transforming a graphic workpiece such as a printed circuit board into a data base which is stored on a disk unit 20. The system described in U.S. Pat. No. 4,352,165 in Column 1, lines 42–61 provides the data for use by the present system for reducing the number of points to be tested on a printed circuit board.

Figure 11:
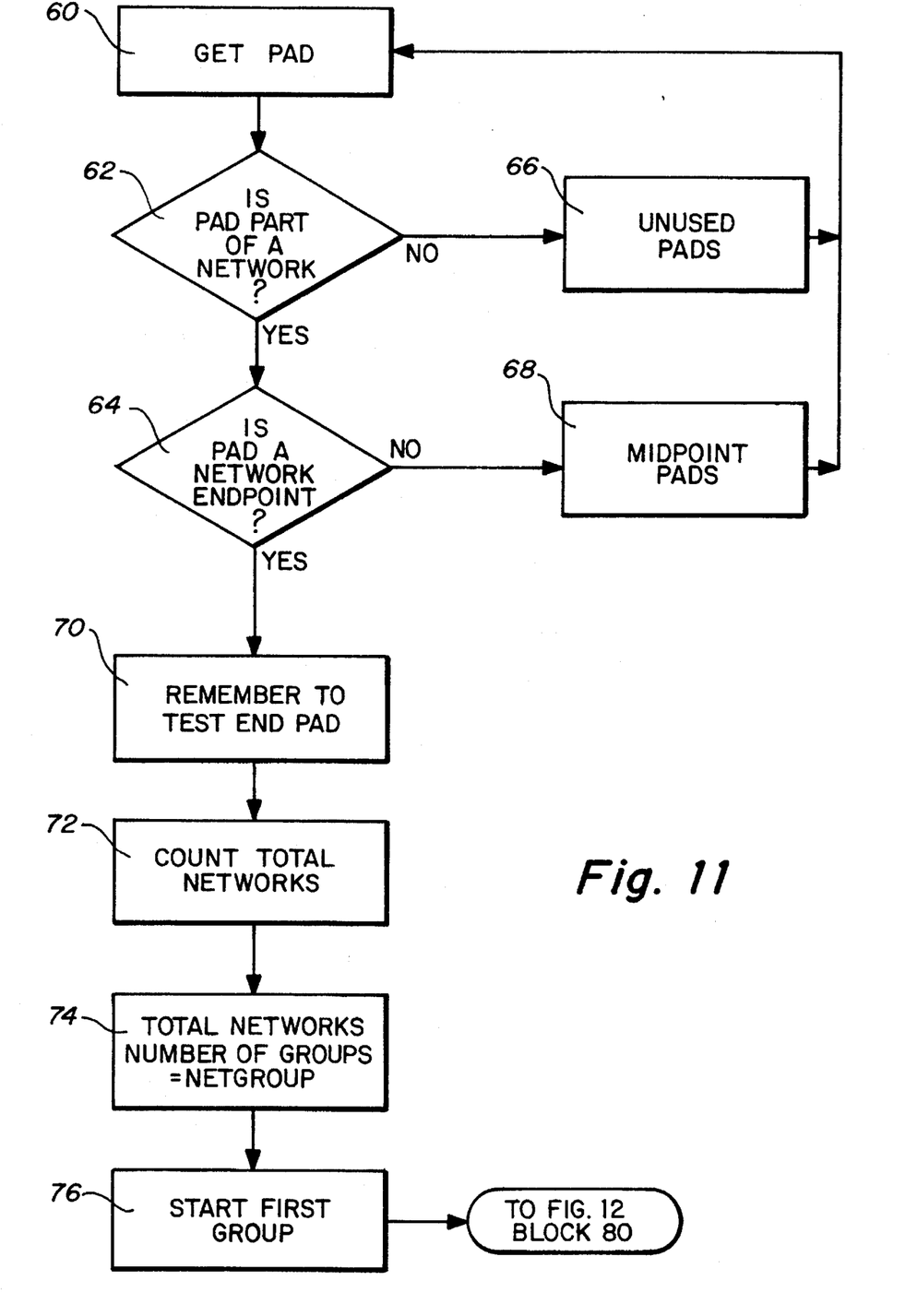
FIGS. 11–15 are computer flow diagrams illustrating the computer software functions performed by the present system.

Referring to FIG. 11, the first step in the present operation is to read the pad file database of the configuration of the network traces present on a printed circuit board supplied by the digitizer data base. The pad data is acquired at block 60. A decision is made at block 62 to determine if a pad is part of a network and a decision is made at block 64 to determine if a pad is a network trace end point. If a pad is an unused pad or a midpoint pad, this fact will be noted at blocks 66 and 68, and this information will be stored in a separate file to subsequently test unused pads but not mid-point pads.

After a determination has been made of the end point pads of each network trace, at block 70, the total number of network traces is counted at block 72. The total number of network traces is then divided by the desired number of network groups to be formed for the printed circuit board under test at block 74. The first circuit network trace group is then tested at block 76.

Figure 12:
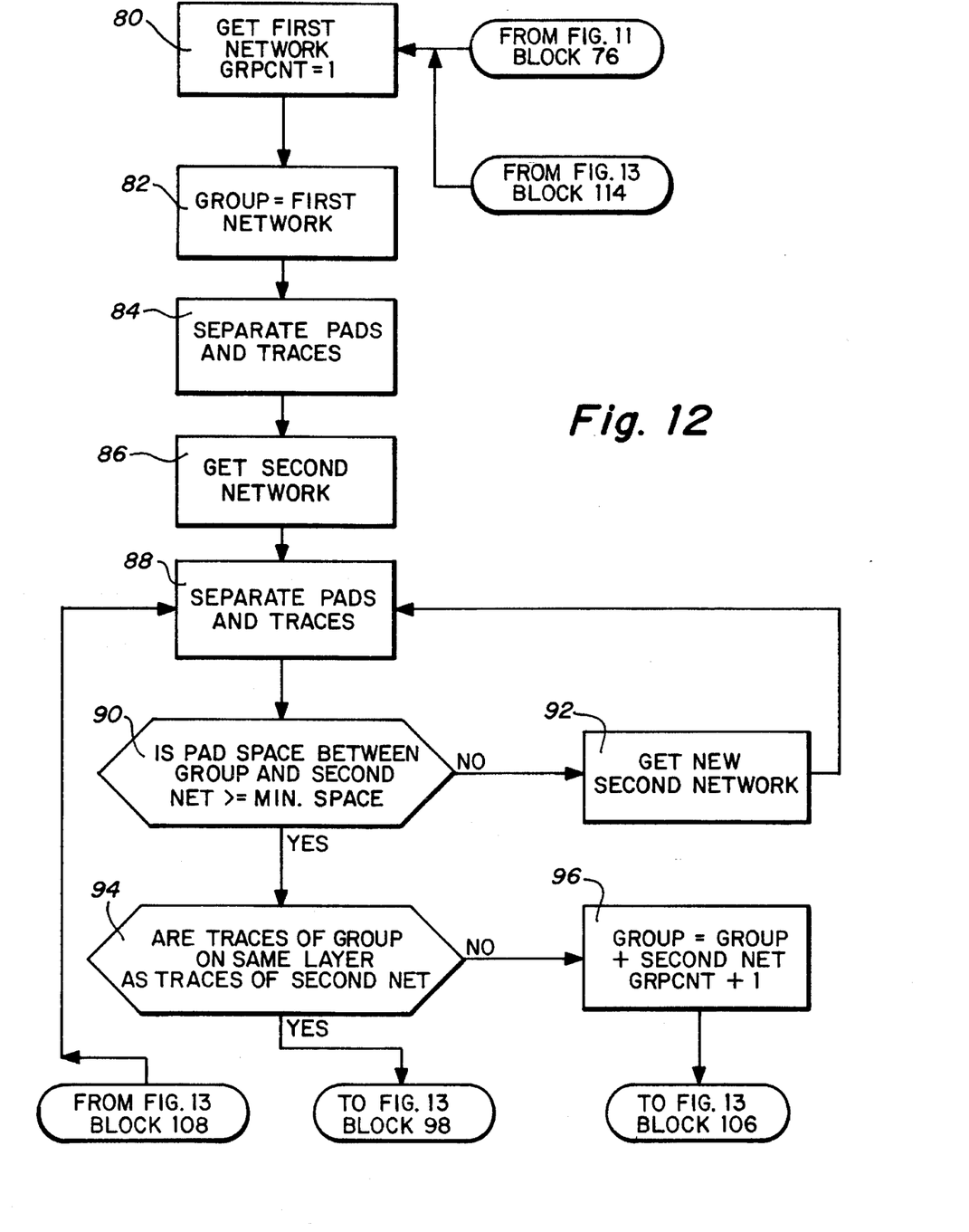

Referring now to FIG. 12, the first network trace is acquired from the database supplied by the digitizer and a counter is set at block 80 representing the first network trace in a first network trace group. The first network trace group is set equal to the first network trace at block 82. The pads associated with each network trace are then separated from the network traces at block 84. A second network trace is acquired from the database of network traces present on the circuit board under test at block 86, and the pads associated with the second network trace are separated from the second network trace at block 88. A decision is then made at block 90 to check for a minimum space between the pads of the pads in the first and second network traces to ensure that a minimum space is greater than a predetermined allowable minimal space. If this space is not greater than or equal to the minimum space, a new second network trace is acquired at block 92 and the comparison continues until the minimum space between pads is achieved. If the minimum spacing between pads is satisfied, a decision is made at block 94 to determine if the network traces of the first group are on a same layer of the printed circuit board as the network traces of the second network. If the decision is no, the group count is incremented at block 96.

Figure 13:
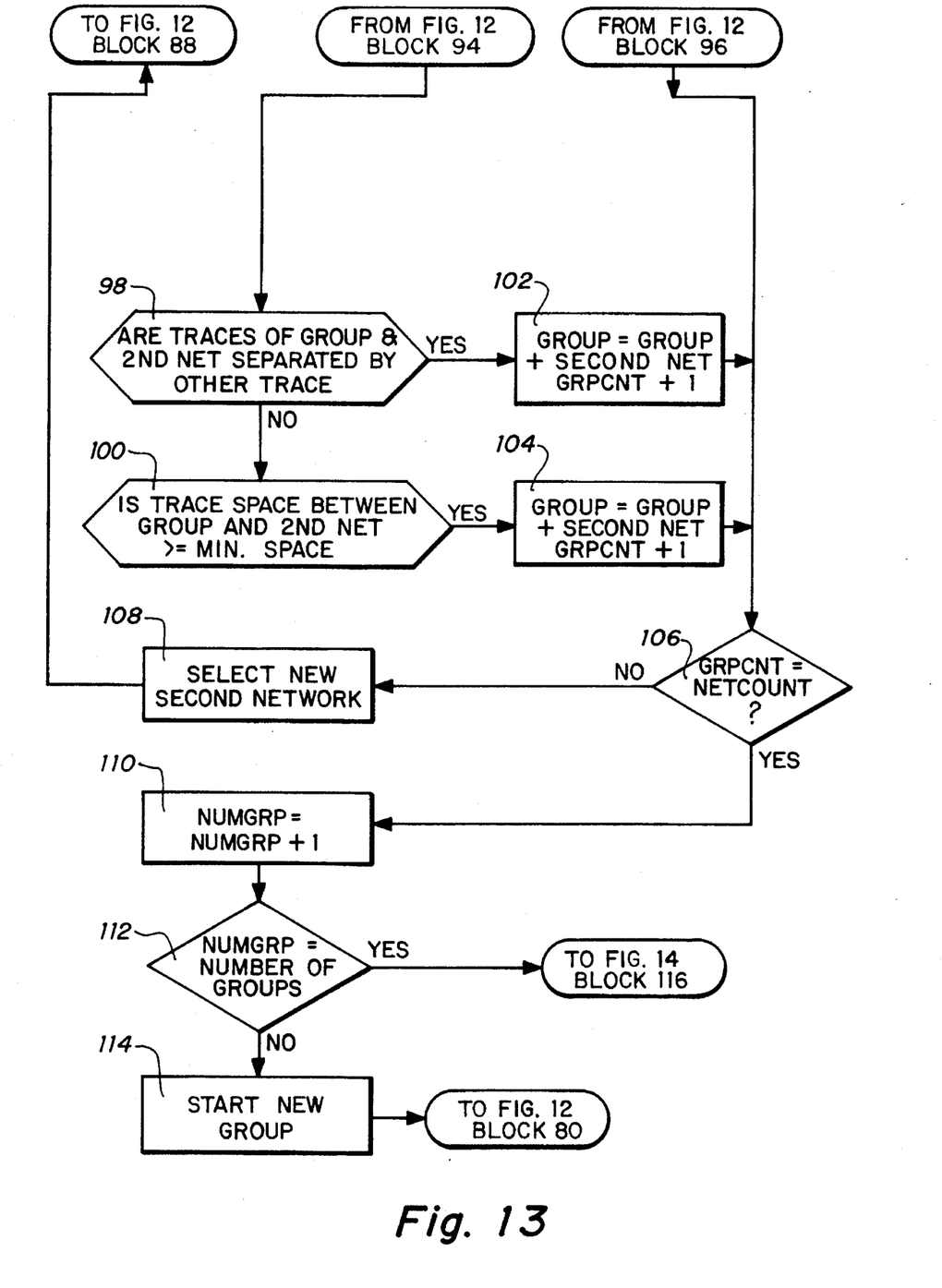

If the decision at block 94 is yes, representing satisfying the layer test, the software flow diagram continues to FIG. 13 at decision block 98 at which the two selected network traces are tested to determine if they are separated by a third network trace. If the decision at block 98 is no, a decision is made at block 100 to determine if the spacing between the two network traces under test is greater than a minimum predetermined space. If the answer at decision blocks 98 or 100 is yes, the group count is incremented by one at blocks 102 and 104, respectively. If the two network traces under test have satisfied all required tests, a decision is then made at decision block 106 to determine if the group count is equal to the desired network group count. If the answer is no, a new second network trace is selected at block 108 and the software flow diagram continues back to block 88 of FIG. 12, to continue the process of separating pads and traces and determining the spacing between subsequent new second traces. If the decision at block 106 is yes, the number of groups selected is incremented by one at block 110. A decision is then made at block 112 to determine if the number of groups is equal to the desired number of groups for the printed circuit board under test. If the decision is no, a new group is started at block 114 and the software program continues to block 80 of FIG. 12 to begin creation of a second network trace group. If the decision at block 112 is yes, the flow diagram continues to FIG. 14.

Figure 14:
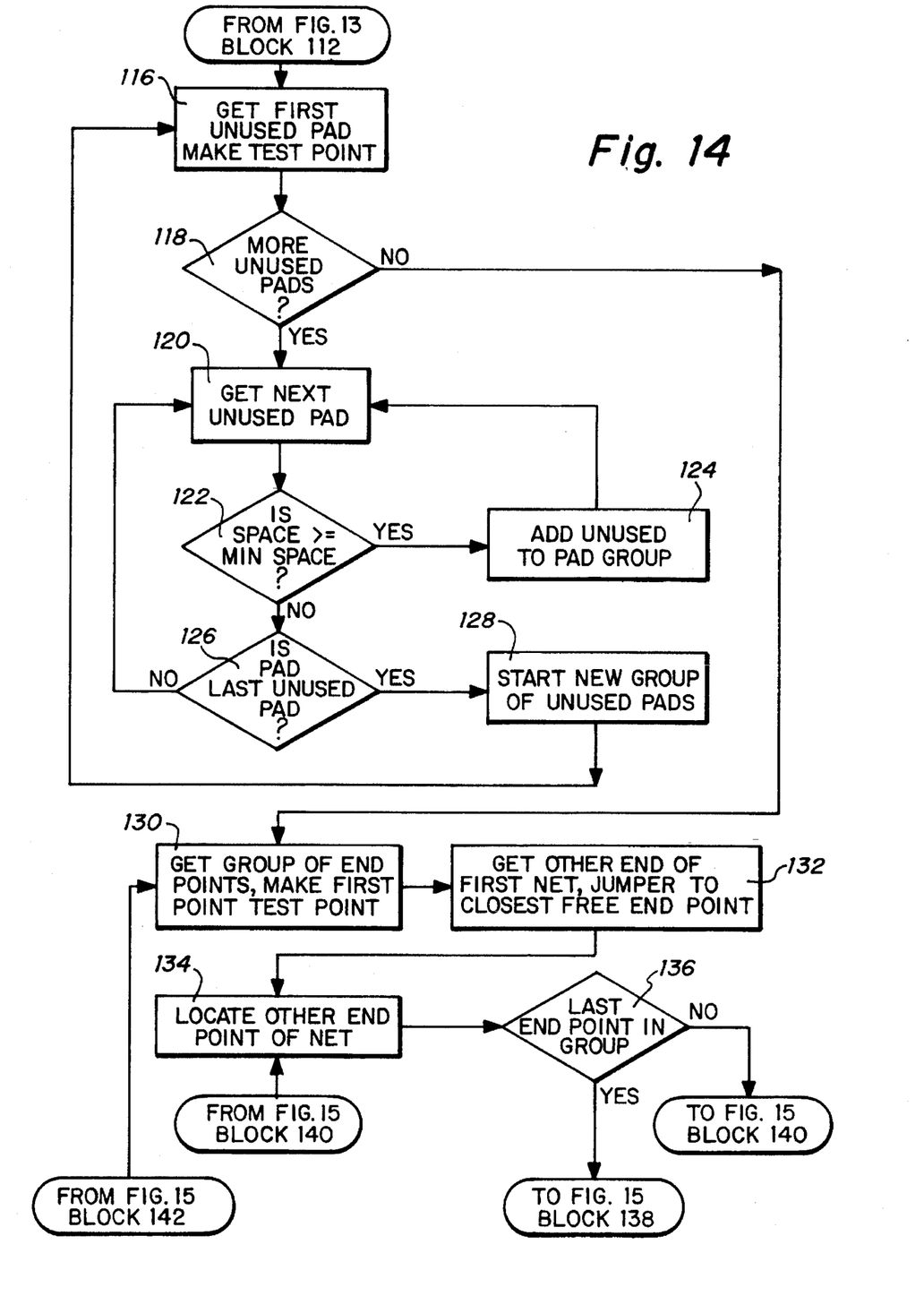

Referring now to FIG. 14, having formed each of the network trace groups of circuit network traces, the unused pad data is acquired at block 116. The unused pads previously designated by the decision at block 62 (FIG. 11) are tested and a decision is made at block 118 to determine if there are more unused pads present in the data file. If the decision is yes, a subsequent unused pad is acquired at block 120, and a decision is made at block 122 to determine if the spacing between unused pads is greater than a predetermined minimum spacing. If this decision is yes, the unused pad is added to the unused pad group at block 124. The computer flow diagram then returns to block 120 to acquire a subsequent unused pad. If the decision at block 122 is no, a determination is made at block 126 to determine if the acquired pad is a last unused pad. If the decision at block 126 is yes, a new group of unused pads is begun at block 128, and the flow diagram returns to block 116 to acquire a first unused pad to generate a new group of unused pads. If the decision at block 126 is no, a next subsequent unused pad is acquired at block 120.

Once all unused pads have been collected into groups, and there are no more unused pads within the data file, the decision at block 118 is no and the flow diagram continues to block 130 to acquire the end points of each unused pad group. The next end point is acquired at block 132 in order to select the points for each jumper between the groups of unused pads. The opposite end of the group of unused pads is determined at block 134. A decision is then made at block 136 to determine if the last end point in a group is located.

Figure 15:
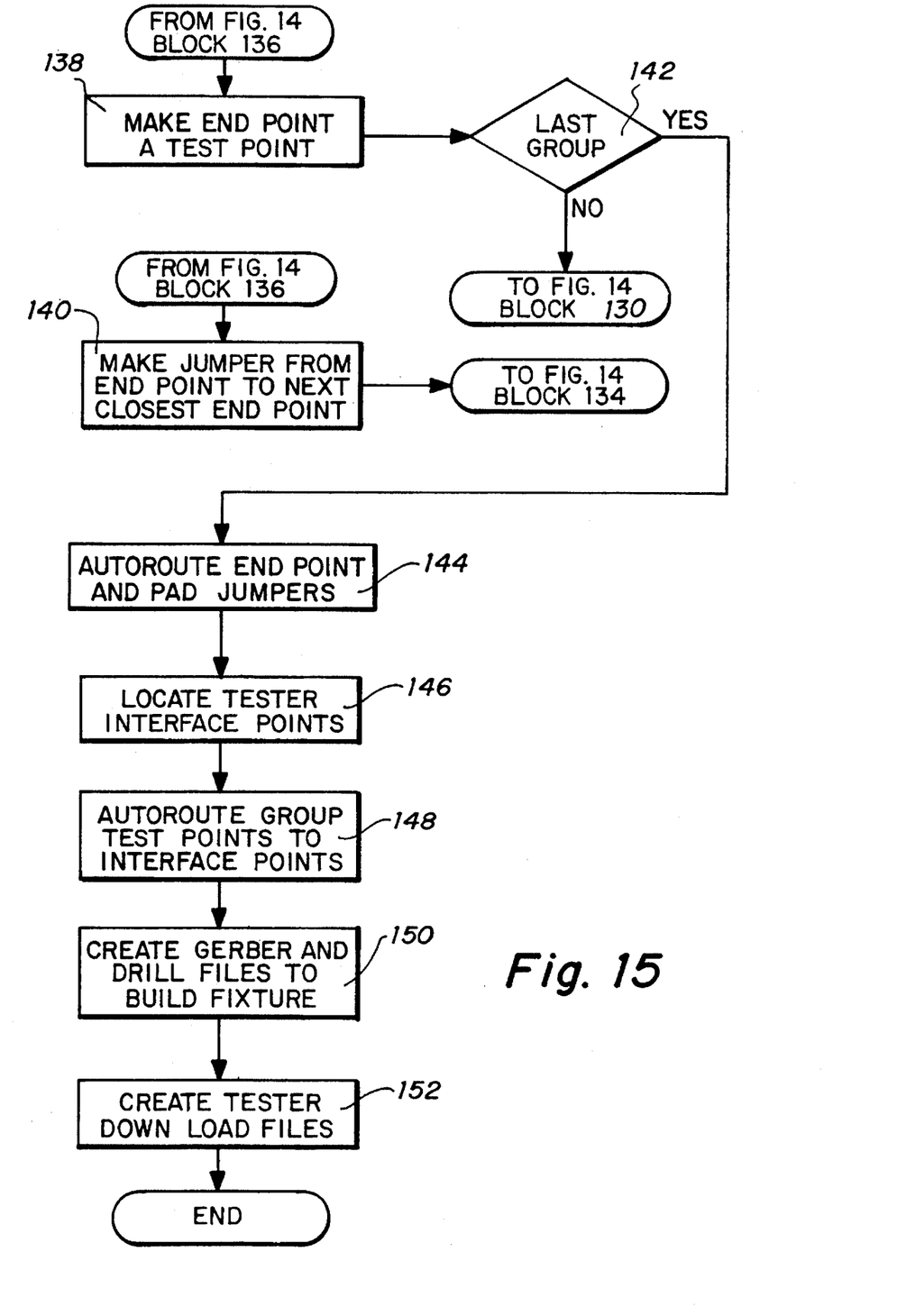

Referring to FIG. 15, if the decision was yes at block 136 (FIG. 14), the end point is designated as a test point. If the decision at block 136 (FIG. 14) is no, a jumper is designated from the end point to the next closest end point at block 140. The computer flow diagram then continues back to block 134 (FIG. 14). If the end point was designated a test point at block 138, a decision is then made at block 142 to determine if the end point is the last of the group. If the decision is no, the flow diagram returns to block 130 (FIG. 14). If the decision at block 142 is yes, all unused pads have been grouped and a jumper between each group has been identified. The end points of the unused pads has therefore been determined.

The next step in the present process is to autoroute the end points and pad jumpers at block 144 to create the interface data for the printed circuit board test system to interface to the desired selected test points determined by the present system. The group test points are autorouted to the test system interface points at block 148 and the Gerber and drill files to build the fixturing necessary to interface the test system to the printed circuit board are created at block 150 and the files are downloaded at block 152 to the test system utilized to test the printed circuit board. The output of block 152 provides the test points to the test system utilized to test a printed circuit board such as, for example, the microprocessor 180 shown in FIG. 12 of the '402 Patent. The output of block 152 may be supplied to microprocessor 180 via minicomputer 182.

It therefore can be seen that the present invention reduces the number of points to be tested on a printed circuit board by analyzing circuit network traces and pads to determine the end points of each network trace. The network traces are then sorted into groups so that no two adjacent network traces are in the same group. The separate network groups each have end points which are interfaced to the printed circuit board test system. The present invention therefore allows for a substantial reduction in the amount of test electronics in an automatic test system to test printed circuit boards while ensuring a true and valid test of all network traces on a printed circuit board. The present invention can be utilized for creating fixturing data for single or dual sided testing of printed circuit boards, and can be used on multi-layer circuit boards using both through hole and surface mount technology to create fixturing for both dedicated and universal grid type automatic test systems.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A printed circuit board test system for reducing the number of points to be tested on a printed circuit board (20), the printed circuit board including a plurality of network traces (24), each network trace having end points (24a, 24b) and a plurality of pads (22), the coordinates of the network traces, end points, and pads being digitally represented and stored in the form of coordinate data in a digital storage media (60, 80, 86), the system comprising:

a circuit board testing device having a test surface including a plurality of test points, and being arranged for contacting the printed circuit board when tested;

processor means (62, 64) operating on the stored coordinate data for identifying the end point coordinates of each network trace of the plurality of network traces;

processor means (82, 84, 86) for identifying pad coordinate data and network trace coordinate data;

processor means (90, 94, 98, 100) for grouping the coordinates of ones of said plurality of network traces located within a predetermined distance of one another to form a plurality of groups of network traces;

processor means (130, 132, 136, 138, 140) for generating coordinate data representing a connection of the identified end points of said network traces within each group of network traces to configure a continuous trace having one pair of end points for each group of network traces; and means responsive to said coordinate data of said one pair of end points for each group of network traces for activating ones of said plurality of test points for testing the printed circuit board (20).

2. The system of claim 1 and further including:

pad grouping processor means (118, 122, 126) for generating coordinate data representing coordinates of ones of the pads located within a predetermined distance of one another to form a plurality of pad groups (124, 128) and for generating coordinate data representing a connection of pads (130, 132) within each pad group of said plurality of pad groups to configure a continuous trace having one pair of end points for each pad group; and means responsive to said coordinate data of said one pair of end points for each pad group for actuating ones of said plurality of test points for testing the printed circuit board.

3. The system of claim 1 wherein said grouping processor means further includes:

means (98, 100) for determining the presence of an intermediate network trace between two adjacent network traces for exclusion of said intermediate network trace from a group of network traces containing said adjacent network traces.

4. The system of claim 2 wherein said pad grouping processor means includes:

means (122, 126) for determining the presence of an intermediate pad between two adjacent pads for exclusion of said intermediate pad from a group of pads containing said adjacent pads.

5. A method for testing a printed circuit board by reducing the number of points to be tested on a printed circuit board (20), the printed circuit board including a plurality of network traces (24), each network trace having end points (24a, 24b) and a plurality of pads (22), the coordinates of the network traces, end points, and pads being digitally represented and stored in the form of coordinate data in a digital storage media (60, 80, 86), comprising the steps of:

providing a printed circuit board testing device having a test surface including a plurality of test points, and being arranged for contacting the printed circuit board when tested;

identifying (82, 84, 86) pad coordinate data and network trace coordinate data;

identifying (62, 64) the end point coordinates of each network trace of the plurality of network traces by analyzing the stored coordinates data;

generating (90, 94, 98, 100) coordinate data representing the coordinates of ones of the plurality of network traces located within a predetermined distance of one another to form a plurality of groups of network traces;

generating (130, 132, 136, 138, 140) coordinate data representing a connection of the identified end points of network traces within each group of network traces to configure a continuous trace having one pair of end points for each group of network traces; and actuating ones of the plurality of test points of the testing device in response to the coordinate data of the one pair of end points for each group of network traces for testing the printed circuit board.

6. The method of claim 5 and further including the step of:

generating (118, 122, 126) coordinate data representing coordinates of ones of the pads located within a predetermined distance of one another to form a plurality of pad groups (124, 128) and for generating (130, 132) coordinate data representing a connection of pads within each pad group of the plurality of pad groups to configure a continuous trace having one pair of end points for each pad group; and actuating ones of the plurality of test points of the testing system in response to the coordinate data of the one pair of end points for each group for testing the printed circuit board.

7. The method of claim 5 and further including the step of:

determining (98, 100) the presence of an intermediate network trace between two adjacent network traces for exclusion of the intermediate network trace from a group of network traces containing the adjacent network traces.

8. The method of claim 6 and further including the step of:

determining (122, 126) the presence of an intermediate pad between two adjacent pads for exclusion of the intermediate pad from a group of pads containing the adjacent pads.

\* \* \* \* \*